United States Patent [19]

Barrett

[11] Patent Number: 5,493,691
[45] Date of Patent: Feb. 20, 1996

[54] OSCILLATOR-SHUTTLE-CIRCUIT (OSC) NETWORKS FOR CONDITIONING ENERGY IN HIGHER-ORDER SYMMETRY ALGEBRAIC TOPOLOGICAL FORMS AND RF PHASE CONJUGATION

[76] Inventor: Terence W. Barrett, 1453 Beulah Rd., Vienna, Va. 22182

[21] Appl. No.: 172,211

[22] Filed: Dec. 23, 1993

[51] Int. Cl.⁶ .................................................. H04B 7/14
[52] U.S. Cl. ................................ 455/20; 455/73; 455/41; 455/89; 307/652
[58] Field of Search .................................. 455/39, 41, 73, 455/20, 89, 94, 343; 307/424, 652; 333/138, 156

[56] References Cited

U.S. PATENT DOCUMENTS

| | | | |
|---|---|---|---|
| 3,300,729 | 1/1967 | Chang | 307/424 |
| 3,973,208 | 8/1976 | Diamond | 328/5 |
| 4,314,373 | 2/1982 | Sellers | 455/73 |
| 4,317,231 | 2/1982 | Maurer et al. | 455/330 |
| 5,285,177 | 2/1994 | Norose | 333/176 |

FOREIGN PATENT DOCUMENTS

WO9323907  11/1993  WIPO.

*Primary Examiner*—Reinhard J. Eisenzopf
*Assistant Examiner*—Lee Nguyen
*Attorney, Agent, or Firm*—Jim Zegeer

[57] ABSTRACT

The present invention provides passive networks which act as the host to nonlinear and parametric interactions, with energy inputs to said networks being caused to "bleed off" auxiliary, and time-delayed conditioning flows resulting in phase modulations to the main input and which achieve, e.g., RF phase conjugation with cancellation of the noise modulation after two-way passage of beams between transmitter and receiver and when used in duplex arrangements. Also, passive networks for noise reduction in communications transmission due to conditioning of electromagnetic fields in higher order group symmetry form. Because a transmitted wave from a network of the present invention is in higher-order group symmetry form, and fields of such higher-order symmetry have a low probability of occurrence naturally, then environmental noise, which is of lower group symmetry form (usually, U(1) symmetry) and has a high probably of natural occurrence, will be excluded from a receiver matched to higher-order symmetry waves. Therefore in the case of communications, less noise will be processed statistically at a receiver designed for SU(2) or higher group symmetry operation, resulting in enhanced signal-to-noise. Also disclosed are passive networks for power transmission resulting in decreased loss in transmission. Higher-order group symmetry matched "receivers" will have enhanced signal-to-noise reception over lower-order symmetry receivers, i.e., leakage to ground will be less.

3 Claims, 4 Drawing Sheets

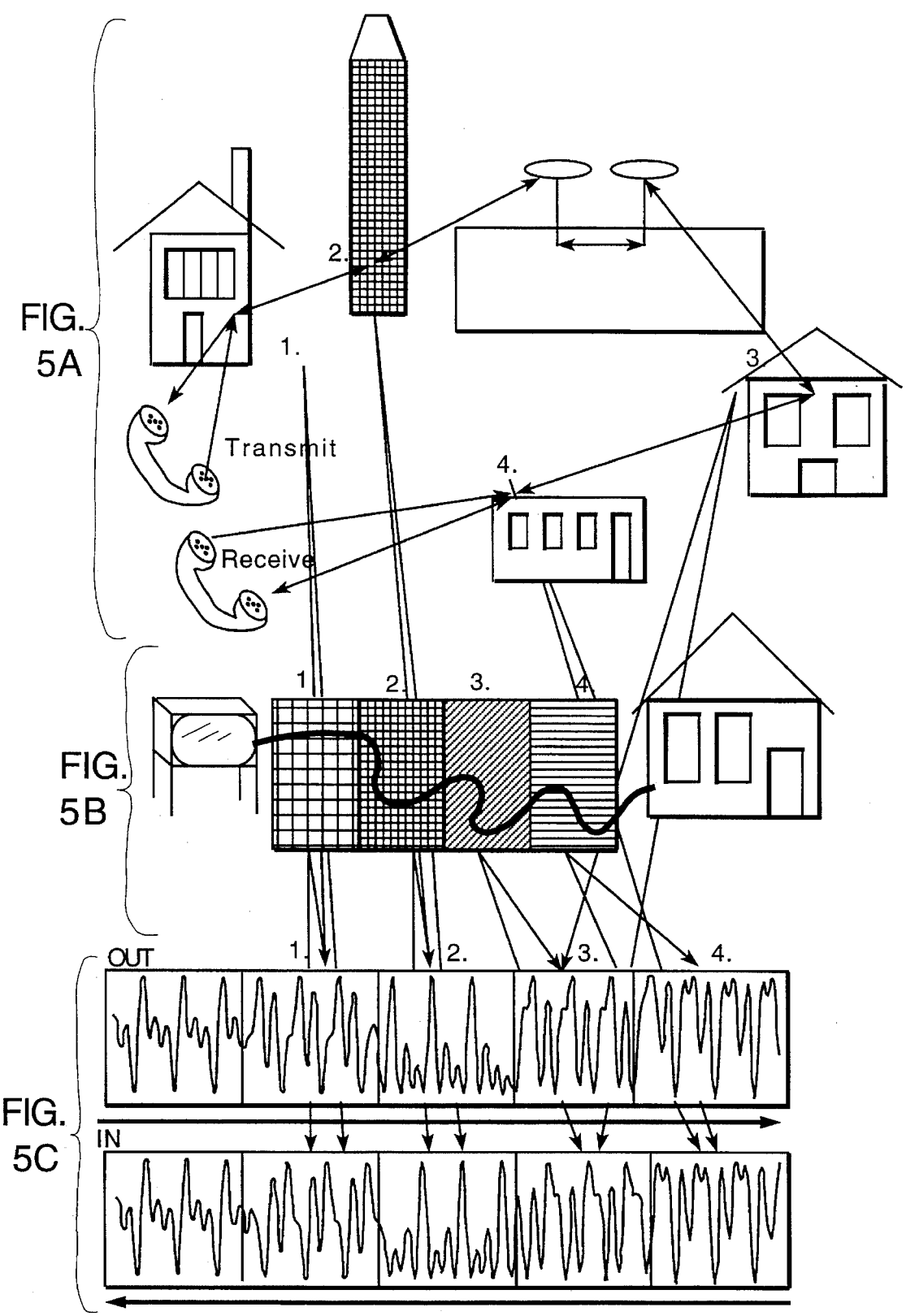

OSCILLATOR-SHUTTLE-CIRCUIT (OSC) NETWORKS FOR CONDITIONING ENERGY IN HIGHER-ORDER SYMMETRY ALGEBRAIC TOPOLOGICAL FORMS AND RF PHASE CONJUGATION

BACKGROUND OF THE INVENTION

The present invention relates generally to parametrically pumped passive RF networks with a single source of energy bled from the input to the networks, to achieve (i) RF phase conjugation of any order; (ii) phase modulation; (iii) noise reduction in communications channels; and (iv) power transmission loss reduction.

The present invention is in the spirit of Tesla's outlook on electromagnetics. Tesla's approach to electrical engineering addresses and accents primarily the inductive-reactive part of electromagnetic field-matter interactions, rather than the resistive part. His approach is more comparable with the physics of nonlinear optics and many-body systems than with that of the single-body systems of current electrical engineering. The Tesla approach is fundamentally a nonlinear many-body approach and may be contrasted with the approach of mainstream electrical engineering, both linear and nonlinear. The nonlinear aspects of mainstream electrical engineering are based on feedback in the resistive field, whereas the nonlinearity in Tesla's approach is based on coupled inductive oscillators using to-and-fro shuttling of energy to and from isolated capacitative stores through non-circuit elements attached to conventional circuits. These network arrangements, which are called oscillator-shuttle-circuit networks herein, or OSC networks (Barrett, 1991), result in adiabatic nonlinearities in complete oscillator-shuttle-circuit systems. OSC networks are inductive-reactive with two-way directional line feedback rather than resistive single-way directional line feedback, the latter being the mainstream approach to nonlinear devices. The OSC network arrangement permits a device or network analog of bulk material nonlinear susceptibilities.

The present invention permits 3-wave, 4-wave ... n-wave mixing using OSC network devices as the host medium, rather than bulk material as the host medium. The present invention also permits RF phase conjugation and the generation of the complex conjugate of an input wave. The interactions of oscillator-shuttles (OS) and circuits (C) to which they are attached to form OSC networks are not describable by linear versions of Kirchhoff's and Ohm's laws. The oscillator shuttles, OSs, of OSC networks are floating grounds which are functionally independent and not common grounds. Multiple isolated "floating" grounds for periodic energy storage and removal by oscillator-shuttles are not describable in the simple monolithic circuit format. The OSC network of the present invention permits a many-body definition of the internal activity of device subsystems which act at different phase relations. The OSC network concept of the present invention is a basis for polyphase systems of energy transfer.

The OSC networks which implement four-wave mixing are algebraic topological analogs of quaternionic systems and more complex OSC networks are analogs of more complex number elements (e.g., Cayley numbers and "beyond Cayley numbers").

OBJECTS OF THE INVENTION

It is desirable to parametrically pump an input to a host device, antenna, substance or network, but without an auxiliary energy source to that same device, antenna, substance or network, other than that bled from the input. Parametric pumping with a single source of energy system can be contrasted with methods of prior art for power control, e.g., with (a) relations which require two or more power sources; (b) parametric pumping (three-wave mixing) in conventional circuit theory, with pump, signal and idler waves, but which requires two or more energy sources; (c) three-wave mixing in nonlinear optics, which requires a nonlinear material to act as host to the interaction; and (d) conventional harmonic generation, which again requires auxiliary energy sources other than that bled from the input. For all of these, including a second-order network of the present invention, the total power flows, W, is given by the same well-known Manley-Rowe relation:

$$W = -\left[\frac{c^2}{2\pi}\right]\left\{\left[\frac{k_{pT,z}\cos^2\alpha_p |E_{pT}|^2}{\omega_p}\right] + \left[\frac{k_{sT,z}\cos^2\alpha_s |E_{sT}|^2}{\omega_s}\right] + \left[\frac{k_{iT,z}\cos^2\alpha_i |E_{iT}|^2}{\omega_i}\right]\right\},$$

where $k_{pT,z}$, $k_{sT,z}$ and $k_{iT,z}$ are the phases of the pump, signal and idler;

$E_{pT}$, $E_{sT}$ and $E_{iT}$ are the total transmitted energies, i.e., the powers, of the pump, signal and idler;

$\alpha_p$, $\alpha_s$ and $\alpha_i$ are the angles between $E_T(\omega_i)$ and $E_{T\perp}(\omega_i)$. However, whereas the power, W, is interpreted as an adiabatic invariant of passive network arrangements in the case of the present invention, it is not so interpreted in the case of parametric networks of prior art, as such networks require an additional auxiliary external signal power source, besides that of the primary. In the case of parametric networks of prior art the Manley-Rowe relation applies to (i) a conventional circuit and its power source, together with (ii) an external modulating signal power source. Because of (ii), prior art describes nonadiabatic and active networks/device, not adiabatic and passive networks/devices.

It is desirable to generate the complex or phase conjugate of an input wave which has been subjected to unwanted noise modulation, in order to compensate for that unwanted modulation. It is also desirable to accomplish this complex or phase conjugate wave generation as a phase conjugate mirror and by RF phase conjugate methods by using network arrangements instead of bulk material.

Accordingly, it is an object of the present invention to provide passive networks, which act as the host to nonlinear and parametric interactions, with energy inputs to such networks being caused to "bleed off" auxiliary, and time-delayed conditioning flows resulting in phase modulations to the main input and which achieve, e.g., RF phase conjugation with cancellation of the noise modulation after two-way passage of beams between transmitter and receiver and when used in duplex arrangements.

It is a further object of the present invention to provide passive networks for noise reduction in communications transmission due to conditioning of electromagnetic fields in higher order group symmetry form. Because a transmitted wave from a network of the present invention is in higher-order group symmetry form, and fields of such higher-order symmetry have a low probability of occurrence naturally, then environmental noise, which is of lower group symmetry form (usually, U(1) symmetry), and has a high probability of natural occurrence, will be excluded from a receiver matched to higher-order symmetry waves. Therefore in the case of communications, less noise will be processed statistically at a receiver designed for SU(2) or higher group symmetry operation, resulting in enhanced signal-to-noise.

It is a further object of the present invention to provide passive networks for power transmission resulting in decreased loss in transmission. Higher-order group symmetry matched "receivers" will have enhanced signal-to-noise reception over lower-order symmetry receivers, i.e., leakage to ground will be less.

A further object of the present invention is specifically provide procedures using OSC network RF phase conjugate mirrors for obtaining relatively noise-free RF communications in Cellular Telephone Communications, Cable Networks and Satellite-Ground Communications.

SUMMARY OF THE INVENTION

The OSC network arrangement of the present invention as a method of energy crafting or conditioning of conducted energy provides a function similar to that provided by wave guides or other field-matter interactions at optical energies. OSC network arrangements offer methods to achieve macroscopic or device nonlinear interactions presently only achieved, with difficulty, in nonlinear optics with bulk material.

A distinction can be made between the adiabatic nonlinear oscillator-shuttle-circuit networks addressing the dynamics of the inductive-reactive field considered here, and nonadiabatic circuits addressing the resistive field. For example, Chua and coworkers have described many nonlinearities in physical systems such as, e.g., four linear passive elements (2 capacitors, 1 inductor and 1 resistor) and one active nonlinear 2-terminal resistor characterized by a 3 segment piecewise linear voltage-current characteristic. Such circuits exhibit: bifurcation phenomena, the Hopf bifurcation, period-doubling cascades, Rössler's spiral and screw type attractors, periodic windows, the Shilnikov phenomenon, the double scroll and the boundary crisis. The tunneling current of Josephson-junction circuits can even be modeled by a non-linear flux-controlled inductor. However, in all these instances of prior art, (i) the nonlinear resistive elements require an energy source to a nonlinear resistor, that energy source being external to that of the primary energy of the circuit, (ii) the resistive field, not the inductive-reactive field, is the operative medium, and (iii) the physical operative mechanism is a one-way circuit, not an OSC network with two-way oscillator shuttles.

The OSC networks of the present invention can be contrasted in other ways with prior art. Treatments of electrical circuits by the oriented graph approach all commence with a one-dimensional cell complex (i.e., a graph) with vertices and branches connecting them, as well as separable loops. Representing the connectivity relations of an oriented linear graph by a branch-vertex matrix $A=\Sigma\alpha_{ij}$, the elements have three values of $+1, -1$, and $0$, depending on whether current is flowing into, out of, or is stationary, at a particular vertex (i.e., $a_{ij}=(+1,-1,0)$). This linear graph representation does not, however, take into account any representation (resulting from modulation) which does not conform to the three values given for $a_{ij}$, e.g., when $a_{ij}$ takes on spinor values, that is, obeys the even subalgebra of a Clifford algebra, or values representing two-way flows into and from a vertex, instead of one-way flows.

There are, however, other approaches to circuit analysis of prior art with are compatible with the approach of the present invention, but which still do not describe or propose OSC networks. For example, Kron equated circuits with their tensor representations. Kron's methods were supported by Roth's demonstration (1955) that network analysis is a practical application of algebraic topology. Roth (1955a,b) showed that Kirchhoff's current law is the electrical equivalent of a homology sequence of a linear graph, and that Kirchhoff's voltage law corresponds to a cohomology sequence, these sequences being related by an isomorphism corresponding to Ohm's law. The algebraic topology approach of this prior art was enhanced considerably further by Bolinder who introduced three-dimensional hyperbolic geometrical transformations to circuit analysis and showed how partially polarized electromagnetic or optical waves can be transformed by Clifford Algebra.

However, this prior art does not address passive network conditioning of network inputs, nor two-way flows to a vertex, even although OSC networks of the present invention can be described in Clifford algebra terms and the simplest OSC networks in quaternion algebra, which is the even subalgebra of a three-dimensional Clifford algebra with Euclidean metric.

Moreover, OSC network arrangements offer network methods to achieve macroscopic or device nonlinear interactions at RF energies (as opposed to optical energies) presently only achieved with difficulty, in nonlinear optics and with bulk material methods.

BRIEF DESCRIPTION OF THE DRAWINGS

FIGS. 5A, 5B, 5C illustrate further application areas of the invention.

DETAILED DESCRIPTION OF THE PREFERRED EMBODIMENT

Figure 1A:
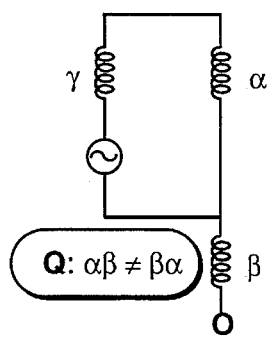
FIGS. 1A, 1B(i), 1B(ii), 1C(i) and 1C(ii) are examples of OSC networks incorporating the invention.
Figure 1B:
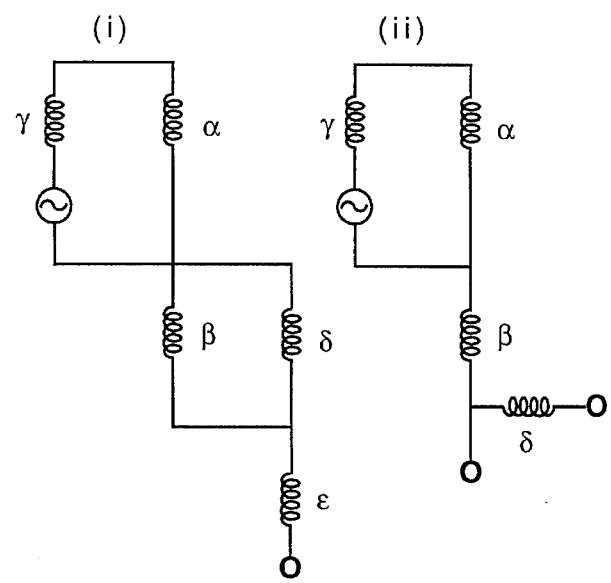
Figure 1C:
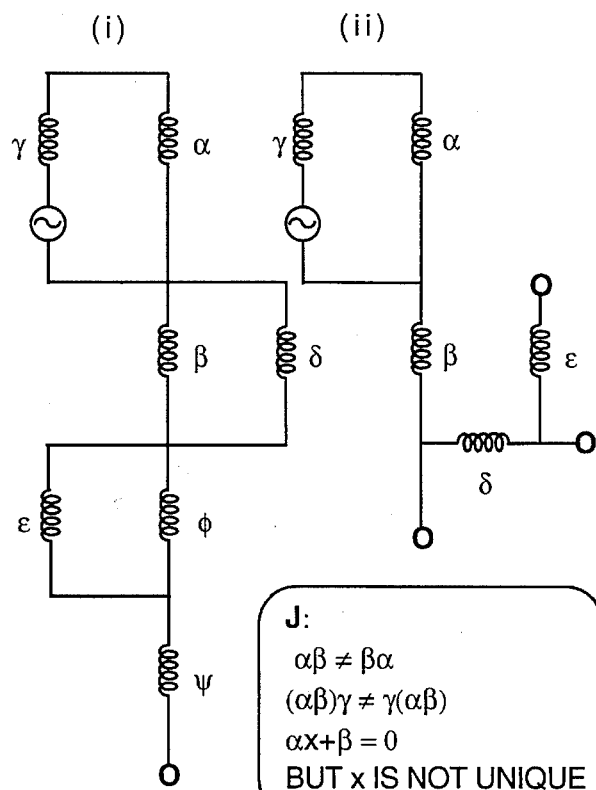

FIGS. 1A, 1B(i), 1B(ii), 1C(i) and 1C(ii) are examples of OSC networks incorporating the invention. FIG. 1A is an OSC network with dimension $2^2$ (SU(2) group symmetry), the algebraic topology of the electrical flows being described in quaternionic numbers, to which number associativity and unique division applies, but commutativity does not. Accordingly, the voltage across $\alpha$ times the voltage across $\beta$ does not equal the voltage across $\beta$ times the voltage across $\alpha$, i.e., $\alpha\beta \neq \beta\alpha$. FIGS. 1B(i) and 1B(ii) are OSC networks with dimension $2^3$ (SU3) group symmetry), the algebraic topology of electrical flows being described in terms of Cayley numbers, to which unique division applies but associativity and commutativity does not. Accordingly, and referring to the voltages, $\alpha$, $\beta$ and $\gamma$: $\alpha\beta \neq \beta\alpha$ and $(\alpha\beta)\gamma \neq \gamma(\alpha\beta)$. FIGS. 1C(i) and 1C(ii) are OSC networks with dimension $2^4$ (SU(4) group symmetry), the algebraic topology of the electrical flows being described in numbers which are known as "beyond Cayley numbers", to which neither associativity nor commutativity nor unique division applies, and referring to the voltages, $\alpha$, $\beta$ and $\gamma$: $\alpha\beta \neq \beta\alpha$; $(\alpha\beta)\gamma \neq \gamma(\alpha\beta)$; and $\alpha x+\beta=0$, but x is not unique.

Figure 2:
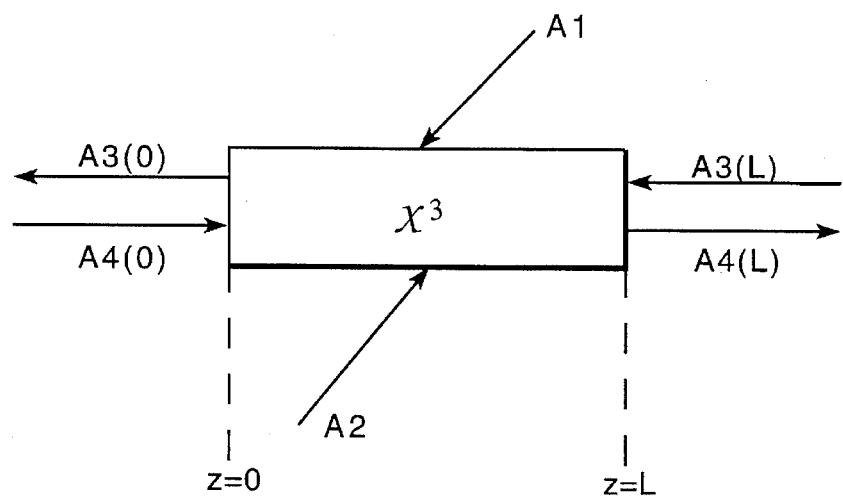
FIG. 2 represents four-wave mixing.

FIG. 2 represents four-wave mixing. The host medium possesses a third-order nonlinear susceptibility, $\chi^3$. There is an input beam A4(0), two pump beams, A1 and A2, and an output beam A3(0). Under conditions of phase conjugation, A3(0) is the complex or phase conjugate of A4(0).

Figure 3:
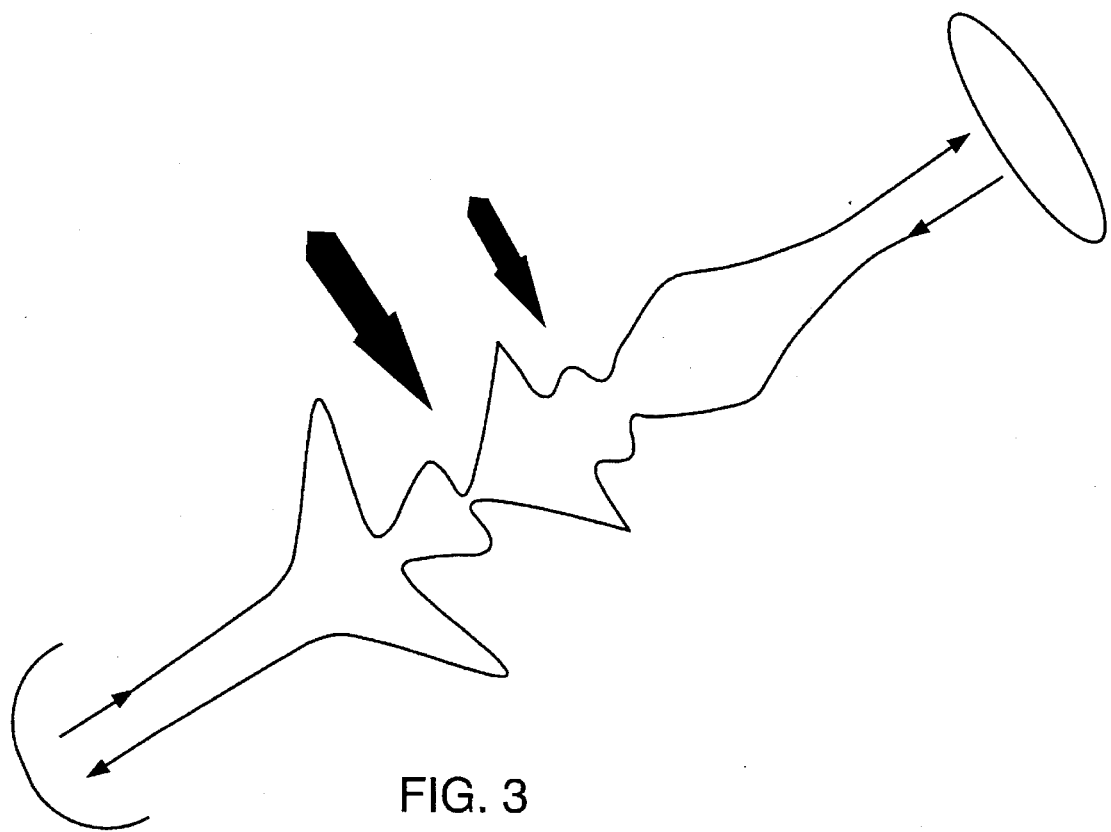
FIG. 3 represents a phase conjugate mirror, FIGS. 4A,B represents an OSC device achieving RF three wave mixing or harmonic wave generation.

FIG. 3 represents a phase conjugate mirror. Two beams are represented. The top beam is greatly modulated before reaching the a second receiver and transmit system. The bottom returning beam is the phase conjugate of the first beam, but it is not modulated on the return path. If the second beam were modulated in an identical fashion to that of the first, the modulation would be canceled by the modulations effected by the second receiver and transmit system (the phase conjugate mirror).

Figure 4A:
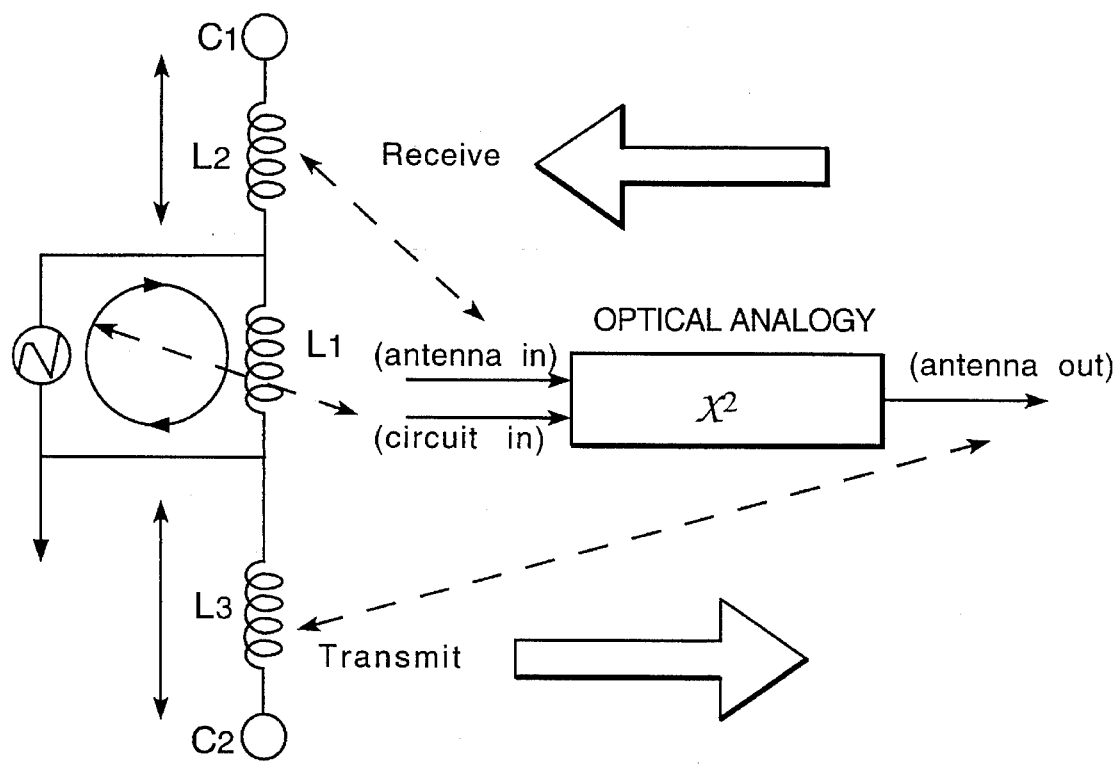
Figure 4B:
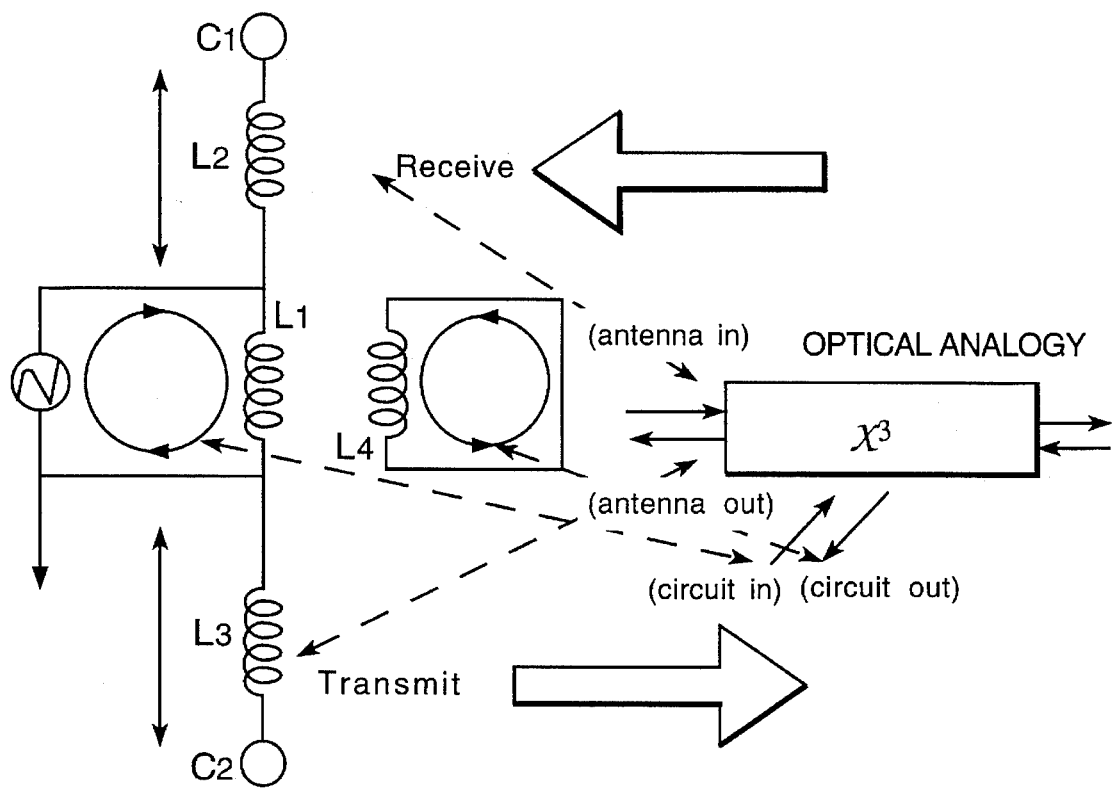

FIG. 4A represents an OSC device achieving RF three wave mixing or harmonic wave generation. $C_1$ and $C_2$ are floating grounds or temporary energy storage locations. $L_1$, $L_2$ and $L_3$ are inductances. The line including $C_1$ and $L_2$ and the line including $C_2$ and $L_3$ are oscillator shuttles and in this embodiment are also receive and transmit antennas, respectively. The transmitted wave is the frequency harmonic of the received wave. FIG. 4B represents an OSC device achieving RF four wave mixing or RF phase conjugation. $C_1$ and $C_2$ are floating grounds or temporary energy storage locations. $L_1$, $L_2$, $L_3$ and $L_4$ are inductances. The line including $C_1$ and $L_2$ and the line including $C_2$ and $L_3$ are oscillator shuttles and in this embodiment are also receive and transmit antennas, respectively. The transmitted wave is the complex or phase conjugate of the received wave.

The operation of an OSC network can be described by a model of prior art used in nonlinear optics for describing radiation-matter interactions. The model applies to the present invention because there exists an analogy between the functioning of OSC networks and coherent coupling between optical modes in a nonlinear optical wave guide with bulk matter playing host to the nonlinear interaction.

For example, if no free charge density is present and the medium is isotropic, the Maxwell's equations are:

$$\nabla \times E = -i\omega\mu_0 H, \quad (1)$$

$$\nabla \times H = i\omega D, \quad (2)$$

$$\nabla \cdot D = 0, \quad (3)$$

$$\nabla \cdot \mu_0 H = 0, \quad (4)$$

and $$D = \epsilon E. \quad (5)$$

By setting $$\mu_0 H = \nabla \times A, \quad (6)$$

introducing this into the first and second Maxwell equations, using the Lorentz gauge and using various mathematical manipulations shown in Barrett (1991), gives: the E and H fields for the x-polarized vector potentials:

$$E = -i\omega \left[ x \left( \psi + \left( \frac{1}{\omega^2\mu_0\epsilon} \right) \frac{\partial^2\psi}{\partial x^2} \right) + \right.$$
$$\left. y \left( \psi + \left( \frac{1}{\omega^2\mu_0\epsilon} \right) \frac{\partial^2\psi}{\partial x\partial y} \right) - i \left( \frac{\beta z}{\omega^2\mu_0\epsilon} \right) \frac{\partial \psi}{\partial x} \right] \quad (7)$$

$$\mu_0 H = \nabla \times A = \{-x \times \nabla_T + i y \beta\} \psi \exp[-i\beta z]. \quad (8)$$

The fields for the y-polarized vector potentials are similar.

If impedance changes are introduced into an OSC network, or the network equivalent of a bulk material nonlinear second-order susceptibility tensor $\chi^{(2)}$ due to the electrical control field and the particular modal conditionings of an OSC network, and if the frequency of the control or signal field is designated: $\omega_2$, and that of the pump field is $\omega_p$, then the impedance change caused by the signal or control field is:

$$\Delta Z_{real} = Z_0 \chi^{(2)} E(\omega_p) E^*(-\omega_2), \quad (9A)$$

$$\Delta Z_{imaginary} = Z_0 \chi^{(2)} E(\omega_w) E^*(\omega_s), \quad (9B)$$

where Z, the complex impedance is:

$$Z(i\omega) = R + i \left( \omega L - \frac{1}{\omega C} \right), \quad (10)$$

with magnitude:

$$Z = \sqrt{R^2 + \left( \omega L - \frac{1}{\omega C} \right)^2}. \quad (11)$$

With the signal or control field defined:

$$E(\omega_2, t) = E_s(t) \exp[i(\omega_s t - \beta_s t)], \quad (12)$$

the pump field defined:

$$E(\omega_p, t) = E_p(t) \exp[i(\omega_p t - \beta_p t)], \quad (13)$$

and these two fields coupled by the OSC network device "nonlinear susceptibility" host-mechanism, the following changes in the impedance occur:

$$\Delta Z_{real} = Z_0 \chi^{(2)} E^*_s(t) \exp[i(\omega_p - \omega_s)t - i(\beta_p - \beta_s)t], \quad (14A)$$

$$\Delta Z_{imaginary} = Z_0 \chi^{(2)} E^*_s(t) E_s(t). \quad (14B)$$

If the network "$\chi^{(2)}$" is purely real (inductive), then only phase changes are produced. If the network "$\chi^{(2)}$" has an imaginary (resistive) component, then power transfer, and even gain, can be obtained for one of the inputs.

The idler field or output from the OSC network is:

$$E_i(\omega_i, t) = |E_s(t)|^2 E_p(t) \exp[i(\omega_p - \omega_s)t - i(\beta_p - \beta_s)t], \quad (15)$$

where $$(\beta_p - \beta_s)^2 = \frac{\int \omega^2 \mu_0 A_0^* \Delta Z A \, dl}{\int A_0^* A \, dl}, \quad (16)$$

and $E_s$ and $E_p$ are defined by Eq.s (12) and (13). The three-body interactive system of $E_i$, $E_s$ and $E_p$ is defined in terms of the A vector potential:

$$E_i(\omega, t) = \left[ \left| \frac{-\omega A_s(t) - i\nabla(\nabla \cdot A_s(t))}{\omega\mu_0\epsilon} \right|^2 \right] \times$$
$$\left[ \frac{-i\omega A_p(t) - i\nabla(E \cdot A_p(t))}{\omega\mu_0\epsilon} \right] \times \exp[i(\omega_p - \omega_s)t - i(\beta_p - \beta_s)t] \quad (17)$$

The quaternionic impedance for an OSC network is then:

$$Z_1 + i_2 Z_2 = R_1 + i_1 \left( \omega_1 L_1 - \frac{1}{\omega_1 C_1} \right) + i_2 \left( R_2 + i_3 \left( \omega_2 L_2 - \frac{1}{\omega_2 C_2} \right) \right), \quad (18)$$

where the subscripts on $i_1$, $i_2$ and $i_3$ distinguish the separate field conditioning of the waveguide-like properties of the OSC network and the subscripts on R, $\omega L$ and $\omega C$ distinguish the circuit, C, elements from the oscillator-shuttle, OS, elements of the network. As the waveguide properties of circuits, C, are fundamentally different from those of oscillator-shuttles, OS, distinguishing the $i_{x,y}$ ($=\sqrt{-1}$, x,y=1,2,3 ..., $i_x i_y = -i_y i_x$, where $i_x$ anticommutes with $i_y$), is a necessary condition for distinguishing the OS and C dynamic interaction of the OSC network total arrangement.

The distinguishing characteristics of higher order OSC networks are in analogy with the dimensions of the number system. The dimensionality of the real numbers is $2^0$; of complex numbers is $2^1$; of quaternions is $2^2$; of Cayley numbers is $2^3$; of "beyond Cayley numbers" is $2^4$; etc. Each number system has an associated OSC network device analog with a higher-order "nonlinear susceptibility".

Quaternions are four-dimensional numbers. The algebra of quaternions is the even subalgebra of a three-dimensional Clifford algebra with Euclidean metric. A quaternion is defined:

$$x = x_0 l + x_1 i + x_2 j + x_3 k,$$

where the scalar multiplication is:

$$cx = cx_0 l + cx_1 i + cx_2 j + cx_3 k,$$

and the sum is:

$$x + y = (x_0 + y_0)l + (x_1 + y_1)i + (x_2 + u_2)j + (x_3 + y_3)k.$$

The product is:

$$xy = (x_0 y_0 - x_1 y_1 - x_2 y_2 - x_3 y_3)l + (x_0 y_1 + x_1 y_0 - x_2 y_3 - x_3 y_2)i + (x_0 y_2 + x_2 y_0 + x_3 y_1 - x_1 y_3)j + (x_0 y_3 + x_3 y_0 + x_1 y_2 - x_2 y_1)k$$

and
$i^2 = j^2 = k^2 = -1^2,$
$li = il = i,$
$lj = jl = j,$
$lk = kl = k,$
$ij = -ji = k,$
$jk = -kj = i,$
$ki = -ik = j.$ The set of quaternions is a division ring. The set satisfies all the axioms for a field except the commutative law of multiplication. If $$x = E_x exp[i\omega_x t - \beta_y t],$$

$$y = E_y exp[i\omega_y t - \beta_y t],$$

$$\bar{x} = x_0 l + x_1 i + x_2 j + x_3 k,$$

$$\bar{y} = y_0 l + y_1 i + y_2 j + y_3 k,$$

then:

$$[x,y] = xy - yx = \begin{bmatrix} 0 & y_1 x_2 - x_1 y_2 & x_0 y_2 - y_0 x_2 & y_3 x_2 - x_3 y_2 \\ x_1 y_2 - y_1 x_2 & 0 & y_0 x_1 - x_0 y_1 & x_1 y_3 - y_1 x_3 \\ y_0 x_2 - x_0 y_2 & x_0 y_1 - y_0 x_1 & 0 & y_0 x_3 - x_0 y_3 \\ x_3 y_2 - y_3 x_2 & y_1 x_3 - x_1 y_3 & x_0 y_3 - y_0 x_3 & 0 \end{bmatrix}.$$

If
$x_0 = E_s^* exp[i\omega_s t],$
$x_1 = E_s exp[i\beta_s t],$
$x_2 = \sqrt{E_p}\ exp[i\omega_p t],$
$x_3 = \sqrt{E_p}\ exp[i\beta_p t],$
then
$\bar{x} = x_0 x_1 x_2 x_3 = |E_s|^2 E_p \{exp[i(\omega_p - \omega_s)t - i(\beta_p - \beta_s)t]\}$
or Eq. (15).

The OSC network of FIG. 1A performs transformations described by quaternion algebra with dimension $2^2$ (SU(2) group symmetry), to which number associativity and unique division applies, but commutativity does not apply. The OSC networks of FIG. 1B perform transformations described by Cayley numbers of $2^3$ dimensions (SU(3) group symmetry), to which unique division applies, but associativity and commutativity does not apply. The OSC networks of FIG. 1C performs transformations described by numbers of $2^4$ dimensions (SU(4) group symmetry), to which neither associativity, nor commutativity nor unique division applies.

Unitary transformations leave the modulus squared of a complex wavefunction invariant. Unitary groups have a determinant equal to $\pm 1$. The elements of a special unitary group, SU(n), have a determinant equal to +1. For the linear transformation of a complex 2-dimensional vector (u,v):

$$\begin{pmatrix} u \\ v \end{pmatrix} = \begin{pmatrix} a & b \\ c & d \end{pmatrix} \begin{pmatrix} u \\ v \end{pmatrix}.$$

If the requirement is that the sum $|u|^2 + |v|^2$ be left invariant under the transformation, and that the determinant be:

$$ad - bc = 1,$$

then the transformation matrix must be:

$$\begin{pmatrix} a & b \\ -b^* & a^* \end{pmatrix}$$

which is the transformation matrix of SU(2). The SU(2) group, which has $2^2 - 1 = 3$ independent parameters, e.g., the spatial coordinates x, y and z, in which case:

$$x = \frac{1}{2}(u^2 - v^2),$$

$$y = \frac{1}{2i}(u^2 + v^2),$$

$$z = uv,$$

and the squared distance $x^2 + y^2 + z^2$ is invariant (Hamermesh, 1959).

In the case of the SU(3) group there are eight Lie group independent generators as there are eight ($3^2 - 1$) independent parameters in the SU(3) group. These eight generators can be represented by a set of 3×3 hermitian matrices:

$$F_1 = \frac{1}{2}\begin{pmatrix} 0 & 1 & 0 \\ 1 & 0 & 0 \\ 0 & 0 & 0 \end{pmatrix}, F_2 = \frac{1}{2}\begin{pmatrix} 0 & -i & 0 \\ i & 0 & 0 \\ 0 & 0 & 0 \end{pmatrix},$$

$$F_3 = \frac{1}{2}\begin{pmatrix} 1 & 0 & 0 \\ 0 & -1 & 0 \\ 0 & 0 & 0 \end{pmatrix}, F_4 = \frac{1}{2}\begin{pmatrix} 0 & 0 & 1 \\ 0 & 0 & 0 \\ 1 & 0 & 0 \end{pmatrix},$$

$$F_5 = \frac{1}{2}\begin{pmatrix} 0 & 0 & -i \\ 0 & 0 & 0 \\ i & 0 & 0 \end{pmatrix}, F_6 = \frac{1}{2}\begin{pmatrix} 0 & 0 & 0 \\ 0 & 0 & 1 \\ 0 & 1 & 0 \end{pmatrix},$$

$$F_7 = \frac{1}{2}\begin{pmatrix} 0 & 0 & 0 \\ 0 & 0 & -i \\ 0 & i & 0 \end{pmatrix}, F_8 = \frac{1}{2\sqrt{3}}\begin{pmatrix} 1 & 0 & 0 \\ 0 & 1 & 0 \\ 0 & 0 & -2 \end{pmatrix},$$

which commute with each other.

Referring now to FIG. 1. The OSC network of FIG. 1A performs transformations described by the SU(2) group and there are $2^2 - 1 = 3$ independent parameters represented by the $\alpha$, $\beta$ and $\gamma$ inductances. The OSC networks of FIG. 1B perform transformations described by the SU(3) group and there are $3^2 - 1 = 8$ independent parameters represented by the $(\alpha,\beta,\gamma),\alpha,\beta,\gamma,\delta,\epsilon$ inductances, where the initial three are represented twice due to the embedding of SU(2) within SU(3). The OSC networks of FIG. 1C perform transformations described by the SU(4) group and there are $4^2 - 1 = 15$ independent parameters represented by the $((\alpha,\beta,\gamma),\alpha,\beta,\gamma,\delta,$ $\epsilon$),$\alpha$,$\beta$,$\gamma$,$\delta$,$\epsilon$,$\phi$,$\psi$ inductances, where the initial three inductances are represented three times, and the following two inductances are represented twice due to the embedding of SU(2) within SU(3), which are then embedded in SU(4).

EXAMPLE #1 OF AN OSC NETWORK

A preferred embodiment of an antenna to be used with OSC network devices in a practical example of an RF phase conjugate mirror is a small loop antenna which has an inductive reactance. Such antennas are the dual of a short dipole which has a capacitative reactance. Thus a small loop antenna can be substituted for the $\beta$ inductance of the OSC of FIG. 1A, for the $\epsilon$ or $\delta$ inductances of FIG. 1B, and for the $\psi$ or $\epsilon$ inductances of FIG. 1C. Such antennas could be used in either the send or receive operation modes and the OSC networks function as "active media".

The present invention provides a wave proportional to the complex conjugate of an input wave by means of OSC networks acting as host to the interaction, i.e., network-based four-wave-mixing and at RF frequencies. Prior art has also achieved four-wave-mixing by means of a nonlinear medium acting as host to the interaction, i.e., medium-based four-wave-mixing and at optical frequencies.

The four-wave-mixing achieved by prior art is described as follows. The medium polarization of the electric field is:

$$\frac{P}{\epsilon_0} = \chi^{(1)} \cdot E + \chi^{(2)} \cdot EE + \chi^{(3)} \cdot EEE + \ldots$$

where P is the polarization, and $\chi^{(1)}$, $\chi^{(2)}$ and $\chi^{(3)}$ are the first, second and third order susceptibilities.

Referring to FIG. 2, the 3rd-order nonlinear polarization $P^{(\omega 3 = \omega 1 + \omega 2 - \omega 3)}$ induced by $A_4$ is described by (Yariv, 1989):

$$P^{(\omega 3 = \omega 1 + \omega 2 - \omega 3)} = \chi^{(3)} A_1(\omega_1) A_2(\omega_2) A_4^*(-\omega_4),$$

$$= \frac{1}{2} \chi^{(3)} A_1 A_2 A_4^* \exp\left[i\{(\omega_1 + \omega_2 - \omega_3)t - (\phi_1 + \phi_2)r + \phi z\}\right] + c.c.,$$

$$= \frac{1}{2} \chi^{(3)} A_1 A_2 A_4^* \exp[i\{\omega t + \phi z\}] + c.c.$$

The local input waves $A_1$, $A_2$ and the information-carrying input wave, $A_4$, are described by:

$$E_i(r,t) = \frac{1}{2} A_i(r_i) \exp[i\{\omega_i t - \phi_i r\}] + c.c.$$

where i=1 or 2 or 4.

The waves 1 and 2 travel in opposition to each other and are phase conjugate so that:

$$\phi_1 + \phi_2 = 0.$$

Because of this phase conjugation, $A_3(L)=0$, and the returning wave is $$A_3(0) = -i \left[\frac{\kappa^*}{|\kappa|} \tan|\kappa|L\right] A_4^*(0), \text{ where}$$

$$\kappa^* = \frac{\omega}{2} \sqrt{\frac{\mu_0}{\epsilon}} \chi^{(3)} A_1 A_2, \text{ and}$$

$$\kappa = \frac{\omega}{2} \sqrt{\frac{\mu_0}{\epsilon}} \chi^{(3)} A_1^* A_2^*,$$

i.e., $A_3(0)$ is proportional to the phase conjugate of the input wave $A_4$.

It is an object of the present invention to achieve such interactions, but with OSC networks, rather than media, acting as host to the interaction, and with the interacting waves at RF frequencies, rather than optical. A scenario for the use of such networks is shown in FIG. 3. which represents a phase conjugate mirror. Two beams are represented. The top beam is greatly modulated before reaching the second receiver and transmit system. The bottom returning beam is the phase conjugate of the first beam, but it is not modulated on the return path. If the second beam were modulated in an identical fashion to that of the first, the modulation would be canceled by the modulations effected by the second receiver and transmit system (the phase conjugate mirror).

FIG. 4A represents an OSC device achieving RF three wave mixing or harmonic wave generation. $C_1$ and $C_2$ are floating grounds or temporary energy storage locations. $L_1$, $L_2$ and $L_3$ are inductances. The line including $C_1$ and $L_2$ and the line including $C_2$ and $L_3$ are oscillator shuttles and in this embodiment are also receive and transmit antennas, respectively. The transmitted wave is the frequency harmonic of the received wave. FIG. 4B represents an OSC device achieving RF four wave mixing or RF phase conjugation. $C_1$ and $C_2$ are floating grounds or temporary energy storage locations. $L_1$, $L_2$, $L_3$ and $L_4$ are inductances. The line including $C_1$ and $L_2$ and the line including $C_2$ and $L_3$ are oscillator shuttles and in this embodiment are also receive and transmit antennas, respectively. The transmitted wave is the complex or phase conjugate of the received wave. FIG. 4B therefore depicts a preferred embodiment of the OSC network RF phase conjugate mirror.

Further Application Areas of the Present Invention

FIG. 5 addresses cellular telephone communications. In FIG. 5A, the RF transmissions from an emitter can be phased modulated by multiple reflections from surfaces 1, 2, 3, and 4. However, if an OSC network retransmits along the same path linkage the phase conjugate signal, then the returning signal can be recaptured (FIG. 5C). The linkage between transmitter and receiver can be probed by fast path-interrogating signals unobserved by the user, so that the RF phase conjugation is available at both transmitter and receiver. In cable communications, FIG. 5B, the RF transmissions from an emitter can be subjected to phase modulation by the cable through which the transmissions take place. In this FIG. 5C, four lengths of cable are shown, 1, 2, 3 and 4, which have different phase modulation properties. Again, the linkage between transmitter and receiver can be probed by fast path-interrogating signals unobserved by the user, so that RF phase conjugation is available at the receiver.

Two application areas are illustrated in FIGS. 5A, 5B and 5C; RF cellular telephone communications and cable communications. A third application area is RF satellite-ground or ground-satellite communications. A fourth application area is RF satellite-satellite communications. In all these application areas, the OSC network provides a returning signal which is phase conjugate to the entering signal. This means that any undesirable phase changes due to the properties of the medium intervening between transmitter and receiver will be removed on the return through the medium back to the transmitter, it being understood that designation of transmitter in a duplex system is arbitrary.

The medium or path between transmitter and receiver can be probed by a known signal at intervals during the transmission to provide knowledge of the phase-altering properties of the medium. In the case of moving communications, e.g., a cellular telephone in an automobile, aircraft, satellite, etc., the medium or path between transmitter and receiver can be probed at set intervals commensurate with the rate of change of the medium or path.

While the invention and preferred embodiments thereof have been disclosed and described, it will be appreciated that other embodiments and adaptations of the invention will be apparent to those skilled in the art.

What is claimed is:

1. An oscillator-shuttle circuit network for conditioning electromagnetic signals, comprising:

an RF energy pump source having first and second pump terminals, an inductor element having first and second end terminals and means connecting said first and second terminals to said first and second pump terminals, respectively, first and second temporary energy storage means, each having an electrical connection end and an electrical free floating end, first means for receiving an RF input signal, said first means for receiving an RF input signal being connected between said electrical connection end and said first terminal of one of said inductor element, and second means connected between said electrical connector end of the second of said temporary storage means and the second end terminal of said inductor element for transmitting an output signal which is harmonically related to said RF energy pump signal and said RF input signal.

2. An oscillator-shuttle circuit network for conditioning energy in higher order algebraic topological forms and RF phase conjugation, comprising:

an RF energy pump source having first and second pump terminals, an inductor element having first and second end terminals and means connecting said first and second end terminals to said first and second pump terminals, respectively, first and second temporary energy storage means, each having an electrical connection end and a free floating end, first means for receiving an input RF signal, said first means for receiving an input RF signal being connected between said electrical connection end and said first end terminal, respectively, second means connected between said electrical connection end of the second of said temporary storage means and said second end terminal for transmitting an output signal which is harmonically related to said RF energy pump signal and said input RF signal.

3. A circuit network for conditioning electromagnetic signals, comprising:

an energy pump source having first and second pump terminals, a first energy storage element having first and second end terminals and means connecting said first and second end terminals to said first and second pump terminals, respectively, first and second temporary energy storage means, each having an electrical connection end and an electrical free floating end, first means for receiving an RF input signal, said first means for receiving an RF input signal being connected between said electrical connection end and said first end terminal of said first energy storage element, and output means connected between said electrical connection end of the second of said temporary storage means and said second terminal of said first energy storage element for transmitting an output signal which is harmonically related to said energy pump signal and said RF input signal.

* * * * *